United States Patent
Kanegae

(10) Patent No.: US 7,390,696 B2
(45) Date of Patent: Jun. 24, 2008

(54) WAFER, SEMICONDUCTOR DEVICE, AND FABRICATION METHODS THEREFOR

(75) Inventor: Arinobu Kanegae, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 212 days.

(21) Appl. No.: 10/983,686

(22) Filed: Nov. 9, 2004

(65) Prior Publication Data

US 2005/0098827 A1   May 12, 2005

(30) Foreign Application Priority Data

Nov. 11, 2003 (JP) ............... 2003-380845
Sep. 22, 2004 (JP) ............... 2004-275701

(51) Int. Cl.
*H01L 21/44* (2006.01)

(52) U.S. Cl. ............ 438/106; 438/118; 438/355; 438/404

(58) Field of Classification Search .......... 438/404, 438/355, 106, 118; 257/347, 506
See application file for complete search history.

(56) References Cited

U.S. PATENT DOCUMENTS

| | | | | |
|---|---|---|---|---|
| 5,036,021 | A | * | 7/1991 | Goto ............... 438/355 |
| 5,258,325 | A | | 11/1993 | Spitzer et al. |
| 5,374,564 | A | | 12/1994 | Bruel |
| 5,637,187 | A | | 6/1997 | Takasu et al. ............ 438/30 |
| 5,869,867 | A | | 2/1999 | Takeuchi |
| 6,235,567 | B1 | * | 5/2001 | Huang ............... 438/202 |
| 6,475,838 | B1 | | 11/2002 | Bryant et al. |
| 6,486,513 | B1 | | 11/2002 | Matsumoto et al. |
| 6,562,666 | B1 | | 5/2003 | Park et al. |
| 7,244,990 | B2 | * | 7/2007 | Takafuji et al. ............ 257/347 |
| 2002/0140030 | A1 | | 10/2002 | Mandelman et al. |
| 2002/0160574 | A1 | | 10/2002 | Zahurak et al. |
| 2003/0047784 | A1 | | 3/2003 | Matsumoto et al. |
| 2003/0183876 | A1 | | 10/2003 | Takafuji et al. ............ 257/347 |
| 2005/0178495 | A1 | | 8/2005 | Aspar et al. |

FOREIGN PATENT DOCUMENTS

| | | |
|---|---|---|
| EP | 0 486 318 | 5/1992 |
| EP | 0 886 306 | 12/1998 |
| EP | 1 463 105 | 9/2004 |
| JP | 5-267563 | 10/1993 |
| JP | 06-291291 | 10/1994 |
| JP | 7-235651 | 9/1995 |
| JP | 8-139180 | 5/1996 |
| JP | 2743391 | 2/1998 |
| JP | 11-024106 | 1/1999 |
| JP | 3141486 | 12/2000 |
| JP | 3278944 | 2/2002 |
| KR | 2001-0086499 A | 9/2001 |
| WO | WO 93/15589 | 8/1993 |

* cited by examiner

*Primary Examiner*—Tuan H Nguyen
(74) *Attorney, Agent, or Firm*—Nixon & Vanderhye, PC

(57) ABSTRACT

In order to fabricate a semiconductor device that can perform at its full capacity, in which (i) a single-crystal silicon integrated circuit is formed on an insulating substrate without an adhesive agent, and (ii) an active region of the single-crystal integrated circuit is not damaged by implantation of hydrogen ions, (a) the single-crystal silicon integrated circuit is formed on the insulating substrate, and (b) the single-crystal silicon integrated circuit is surrounded by an oxide (buried oxide layer made of silicon dioxide).

4 Claims, 10 Drawing Sheets

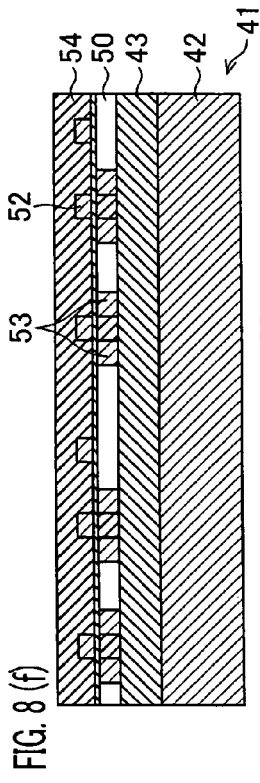
FIG. 8 (a)
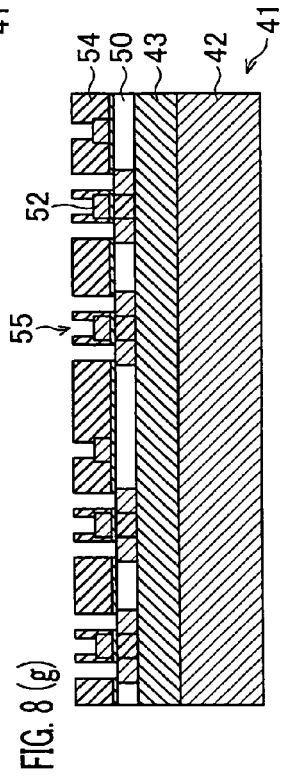
FIG. 8 (b)
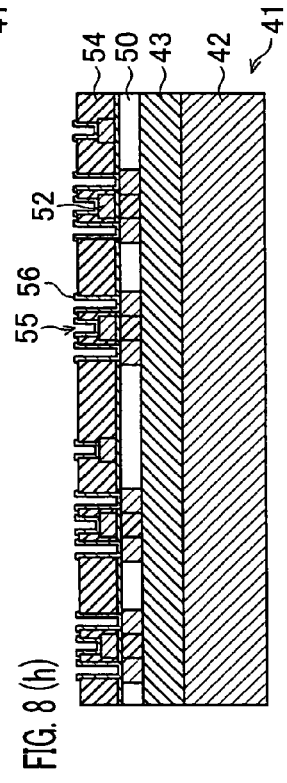
FIG. 8 (c)
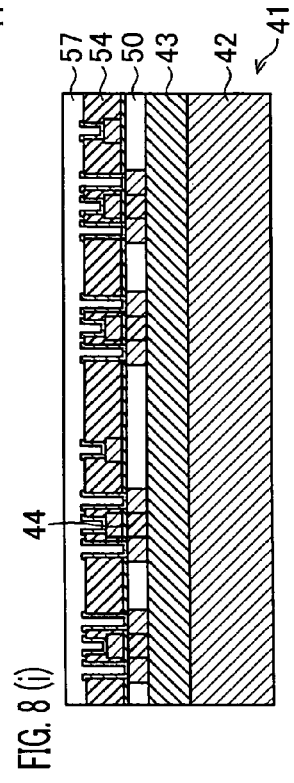
FIG. 8 (d)
FIG. 8 (e)
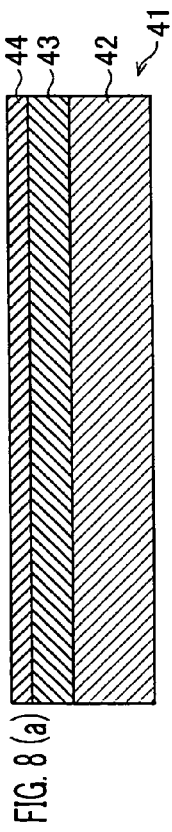
FIG. 8 (f)
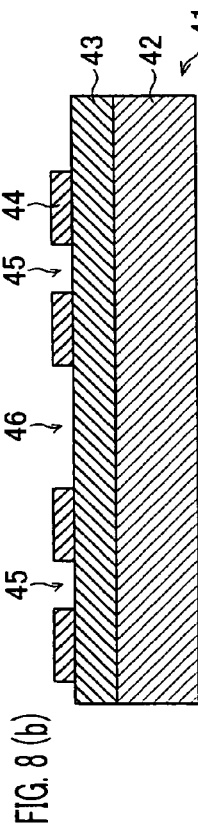
FIG. 8 (g)
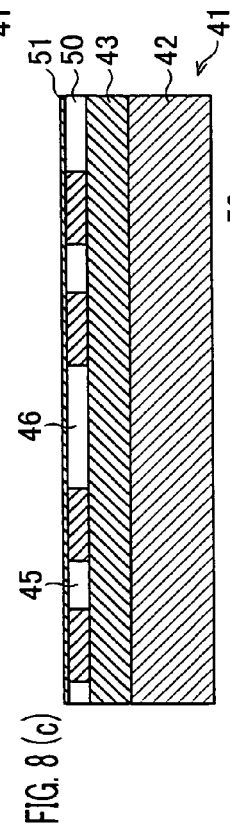
FIG. 8 (h)
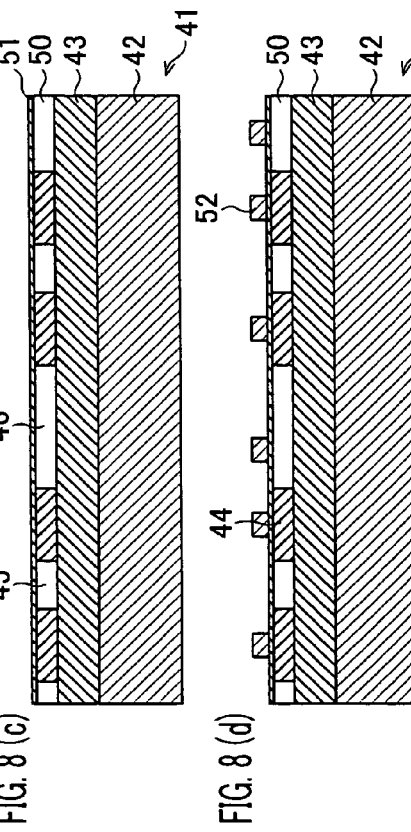
FIG. 8 (i)
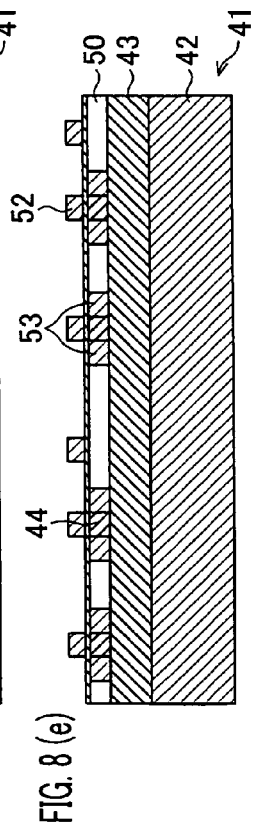

WAFER, SEMICONDUCTOR DEVICE, AND FABRICATION METHODS THEREFOR

This Nonprovisional application claims priority under 35 U.S.C. § 119(a) on patent applications Ser. No. 380845/2003 filed in Japan on Nov. 11, 2003 and No. 2004/275701 filed in Japan on Sep. 22, 2004, the entire contents of which are hereby incorporated by reference.

FIELD OF THE INVENTION

The present invention relates to a wafer including single-crystal silicon integrated circuits, and a semiconductor device in which a single-crystal silicon integrated circuit cut out from the wafer is arranged on an insulating substrate. The present invention further relates to methods for fabricating the wafer and the semiconductor.

BACKGROUND OF THE INVENTION

An active matrix driving device has been widely used as a driving device for a liquid crystal display panel, an OLED (Organic Light Emitting Diode), or other displays. The active matrix driving device adopts a semiconductor device in which thin film transistors (TFTs) made of amorphous silicon or polycrystalline silicon are arranged on a glass substrate.

In recent years, an active matrix driving device has adopted a semiconductor device in which a polycrystalline silicon integrated circuit is arranged on an insulating substrate such as a glass substrate. In this polycrystalline silicon integrated circuit, peripheral drivers are integrated by using the polycrystalline silicon.

The high fineness of a display device such as the liquid crystal display panel calls for high-performance of the active matrix driving device to be used.

Under the circumstances, a study has been made on the use of a semiconductor device adopting a single-crystal silicon integrated circuit, in the active matrix driving device. This is because the single-crystal silicon integrated circuit has higher performance than that of the polycrystalline silicon integrated circuit.

For example, a Japanese translation of unexamined PCT publication No. 7-503557/1995 (Tokuhyouhei 7-503557; Published on Apr. 13, 1995) discloses a method for forming a single-crystal silicon integrated circuit on an insulating substrate such as a glass substrate. In the method disclosed in the published Japanese translation of PCT application, an integrated circuit (a single-crystal silicon layer) is formed on a silicon substrate, prior to bonding the integrated circuit with the insulating substrate via an adhesive agent.

Apart from the method in which the adhesive agent is used for bonding the insulating substrate with the single-crystal silicon integrated circuit, which is preliminary formed, there is another method for forming the single-crystal integrated circuit on the insulating substrate. In the other method, a silicon substrate is bonded with the insulating substrate, and then a thinning process is carried out to form an SOI (Silicon On Insulator) configuration.

Examples of the semiconductor device utilizing the SOI configuration are disclosed in Japanese Patents No. 2743391 (issued on Feb. 6, 1998), No. 3141486 (issued on Dec. 22, 2000), and No. 3278944 (issued on Feb. 22, 2002).

For example, unexamined patent publication No. 5-211128/1993 (Tokukaihei 5-211128; published on Aug. 20, 1993) discloses a method for fabricating the SOI configuration called Smart Cut method. By utilizing the Smart Cut method, it is possible to bond the single-crystal silicon with the insulating substrate, without the adhesive agent.

Namely, in the Smart Cut method, hydrogen ions having a predetermined concentration are implanted into a silicon substrate so as to have a predetermined implanted depth. This silicon substrate is bonded with an insulating substrate serving as a handling wafer. Then, the single-crystal silicon layer is separated by annealing from the silicon substrate at a portion where hydrogen ions are implanted, thereby forming the SOI configuration.

By forming a single-crystal silicon integrated circuit on the single-crystal silicon layer separated from the silicon substrate based on the process described above, a semiconductor device in which the single-crystal silicon integrated circuit is formed on the insulating substrate.

However, in cases where the single-crystal silicon integrated circuit is bonded with the insulating substrate via the adhesive, heat resistance causes a problem. More specifically, for example, after the insulating substrate is bonded with the single-crystal silicon integrated circuit via the adhesive agent, it is not possible to carry out a process requiring heat treatment or a process of forming a high quality inorganic insulating film or a TFT with respect to the insulating substrate. Thus, restrictions occur on a fabrication process and/or a device configuration.

Unlike the method in which the adhesive agent is used for the bonding, according to the method in which the single-crystal silicon integrated circuit is formed on the insulating substrate, the restrictions do not occur on the fabrication process and/or the device configuration. This is because the single-crystal silicon layer (the layer to become the single-crystal silicon integrated circuit) is formed on the insulating substrate without the adhesive agent, like in a method such as the Smart Cut method. Instead, the following problem occurs.

In the Smart Cut method, the hydrogen ions are implanted into the silicon substrate, so that the single-crystal silicon layer is formed. Note that the hydrogen ions may be implanted into an active region, in which a field effect transistor (FET) or other devices are formed, in the single-crystal silicon layer. This causes the active region to be damaged. When the active region is damaged by the implantation of the hydrogen ions, the problem occurs that it is not possible to fully demonstrate the performance of an element such as the field effect transistor.

SUMMARY OF THE INVENTION

In view of the foregoing problems, the present invention is made, and an object of the present invention is to provide a semiconductor device and a fabrication method therefor in which a single-crystal silicon integrated circuit is bonded with an insulating substrate without an adhesive agent, the semiconductor device in which an active region of the single-crystal silicon integrated circuit is not damaged by an implantation of hydrogen ions, thereby exhibiting full capacity of an element.

In order to achieve the foregoing object, a semiconductor wafer in accordance with the present invention, includes (a) a buried oxide layer formed on a silicon substrate; (b) a desired number of single-crystal silicon integrated circuits formed in an active layer on the buried oxide layer; and (c) an oxide for covering the single-crystal silicon integrated circuits, the oxide being filled in (i) a region between adjacent single-crystal silicon integrated circuits, and (ii) a region between adjacent elements in each of the single-crystal silicon integrated circuits, the oxide having such a depth that reaches the buried oxide layer. It should be noted that the oxide may be made of the same material as the buried oxide layer.

According to the semiconductor wafer of the present invention, as mentioned above, a desired number of single-crystal silicon integrated circuits are formed on the silicon active layer of the buried oxide layer formed on the silicon substrate. This allows an arrangement in which the single-crystal silicon integrated circuits (single-crystal silicon layer) are separated by the buried oxide layer from silicon substrate.

The buried oxide layer is an oxide film which is formed by simultaneously carrying out with respect to the silicon substrate an annealing at a high temperature and an ion implantation of oxygen so that an oxide film layer is formed at a predetermined depth from the surface of the silicon substrate.

Furthermore, an oxide covers the single-crystal silicon integrated circuits, and the oxide is filled in (i) a region between adjacent single-crystal silicon integrated circuits, and (ii) a region between adjacent elements in each of the single-crystal silicon integrated circuits, the oxide having such a depth that reaches the buried oxide layer. As such, when the single-crystal silicon integrated circuits are cut out from the wafer together with the oxide film layer, each of the single-crystal silicon integrated circuits is surrounded by the oxide.

This allows an elimination of the problems occurred in the case where a single-crystal silicon integrated circuit is bonded with an insulating substrate via an adhesive agent. More specifically, for example, it is possible to carry out a process which requires a heat treatment with respect to the insulating substrate and/or a process for forming an inorganic insulating layer or TFT with high quality, while the single-crystal silicon integrated circuit is bonded with the insulating substrate. Thus, it is possible to increase the freedom in terms of a fabricating process or a device structure.

When the oxide is made of the same material as the buried oxide layer, the single-crystal silicon integrated circuit which is cut out from wafer is surrounded by the oxide. As such, it is possible to equalize characteristics, such as a resistance to the etching, in all directions.

Note that it is possible to obtain a wafer, having the above configuration in which each of the single-crystal silicon integrated circuits is surrounded by the oxide, by the following fabricating method.

In order to achieve the foregoing object, a method for fabricating a semiconductor wafer in accordance with the present invention, includes the steps of: (A) forming an buried oxide layer on a silicon substrate; (B) forming a desired number of single-crystal silicon integrated circuits in an active layer on the buried oxide layer; (C) causing (i) a separation of the single-crystal silicon integrated circuits, and (ii) a separation of elements in each of the single-crystal silicon integrated circuits to be simultaneously carried out by using an oxide; and (D) causing the single crystal silicon integrated circuits to be surrounded by the oxide.

As described above, by simultaneously carrying out (i) the separation of the single-crystal silicon integrated circuits, and (ii) the separation of elements in each of the single-crystal silicon integrated circuits by using an oxide, it is possible to improve in the yield without adding any fabricating process.

In order to achieve the foregoing object, a semiconductor device in accordance with the present invention includes at least a single-crystal silicon integrated circuit on an insulating substrate, wherein the single-crystal silicon integrated circuit is surrounded by an oxide. Note that the insulating substrate may include a non-single-crystal silicon transistor, and the oxide may be a silicon dioxide.

The semiconductor device of the present invention is arranged such that each of the single crystal silicon integrated circuits is surrounded by the oxide. As such, because of the following reason, it is possible to bond the insulating substrate with the single crystal silicon integrated circuit, without an adhesive agent.

This allows an elimination of the problems occurred in the case where a single-crystal silicon integrated circuit is bonded with an insulating substrate via an adhesive agent. More specifically, for example, it is possible to carry out a process which requires a heat treatment with respect to the insulating substrate and/or a process for forming an inorganic insulating layer or TFT with high quality, while the single-crystal silicon integrated circuit is bonded with the insulating substrate. Thus, it is possible to increase the freedom in terms of a fabricating process or a device structure.

For example, a non-single-crystal silicon transistor may be formed on the insulating substrate, along with the single-crystal silicon integrated circuit. In this case, the non-single-crystal silicon transistor indicates a transistor which is formed in an amorphous silicon layer or in a polycrystalline silicon layer.

As is clear from the description, it is possible to easily apply a semiconductor device having the above configuration to a TFT-LCD display device, a TFT-OLED display device. It is also possible to uniformize and stabilize the characteristics of the elements such as transistors constituting the single-crystal silicon integrated circuit of each semiconductor device. This allows an improvement in display properties of the respective display devices.

When the oxide is a silicon dioxide, each single-crystal silicon integrated circuit is surrounded by the silicon dioxide.

This allows equalization of characteristics, such as a resistance to the etching, in all directions.

It is possible to obtain a semiconductor device in which each of the single-crystal silicon integrated circuits is surrounded by the oxide, by the following fabricating method, for example.

In order to achieve the foregoing object, a method for fabricating a semiconductor device in accordance with the present invention in which the semiconductor device includes at least a single-crystal silicon integrated circuit on an insulating substrate, said method includes the steps of: (A) forming a desired number of single-crystal silicon integrated circuits on a semiconductor wafer in which a buried oxide layer is formed on a silicon substrate; (B) carrying out, simultaneously, a separation of adjacent single-crystal silicon integrated circuits and a separation of adjacent elements in each of the single-crystal silicon integrated circuits; (C) cutting out the single-crystal silicon integrated circuits from the semiconductor wafer such that the single-crystal silicon integrated circuits have the buried oxide layer after being cut out; (D) bonding the insulating substrate with a surface, opposite to a surface on which the buried oxide layer is formed, of the single-crystal silicon integrated circuit.

With the foregoing method, it is possible to obtain a semiconductor device in which each of the single-crystal silicon integrated circuits is surrounded by the oxide. Further, as described above, by simultaneously carrying out (i) the separation of the single-crystal silicon integrated circuits, and (ii) the separation of elements in each of the single-crystal silicon integrated circuits by using an oxide, it is possible to simplify the fabrication process. In other words, it is possible to improve the yield without adding any fabricating process.

Additional objects, features, and strengths of the present invention will be made clear by the description below. Further, the advantages of the present invention will be evident from the following explanation in reference to the drawings.

BRIEF DESCRIPTION OF THE DRAWINGS

FIG. 8(a) through FIG. 8(i) are diagrams showing steps of fabricating the single-crystal silicon integrated circuits.

DESCRIPTION OF THE EMBODIMENTS

Embodiment 1

An embodiment of the present invention is described as follows.

Figure 1:
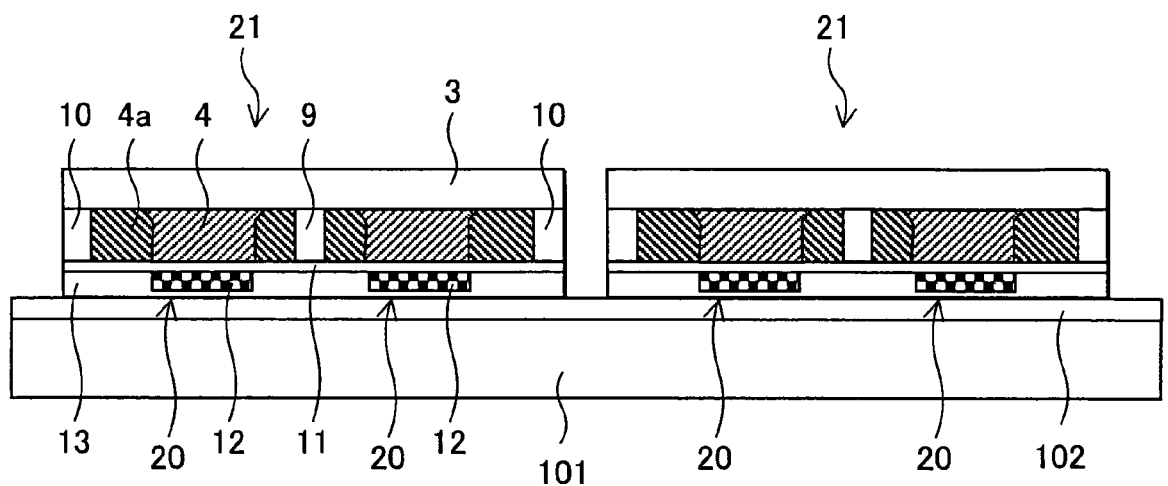
FIG. 1 shows an embodiment in accordance with the present invention, and is a schematic cross sectional view showing a main part of a semiconductor device.
Figure 2:
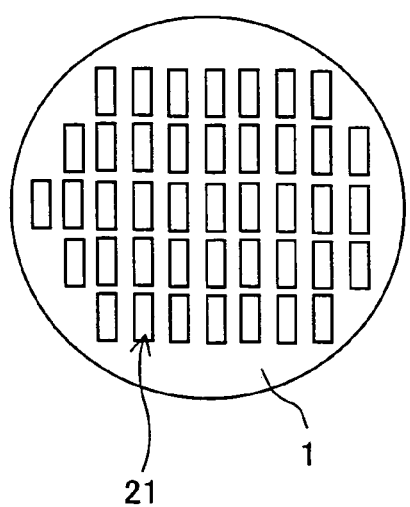
FIG. 2 is a schematic plane view showing an SOI wafer having single-crystal silicon integrated circuits shown in FIG. 1.

A semiconductor device of the present invention is so arranged as shown in FIG. 1 that a single-crystal silicon integrated circuit (Hereinafter referred to as single-crystal silicon IC) 21 is bonded to an insulating substrate 101 made of a glass substrate, via an oxide film 102 made of silicon dioxide. Such a single-crystal silicon IC 21 is cut out from an SOI (Silicon On Insulator) wafer 1 shown in FIG. 2. FIG. 2 is a plane view showing the SOI wafer 1 on which the single-crystal silicon IC 21 is formed.

The following describes a method for fabricating the semiconductor device having the foregoing configuration, with reference to FIG. 3(a) through FIG. 3(c), FIG. 4(a) and FIG. 4(b) showing steps of fabricating the single-crystal silicon IC 21.

First described is the SOI wafer 1 on which the single-crystal silicon IC 21 is formed.

Figure 3A:
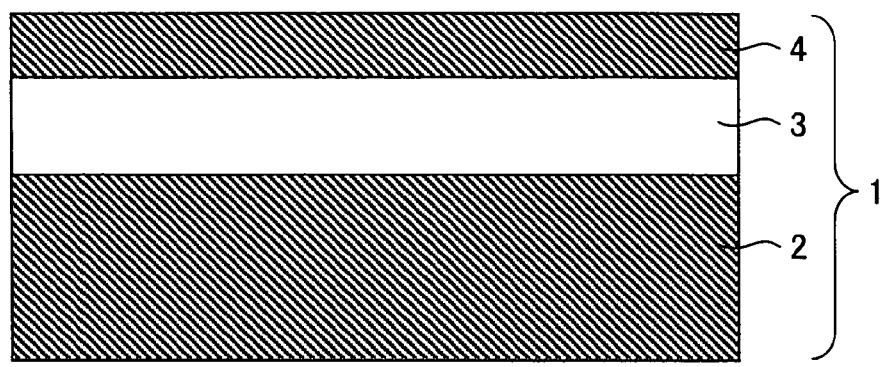
FIG. 3(a) through FIG. 3(c) are diagrams showing steps of fabricating the single-crystal silicon integrated circuits.

As shown in FIG. 3(a), the SOI wafer 1 includes three layers, i.e., a silicon layer 2, a BOX layer (silicon oxide film (Buried Oxide)) 3, and an active layer (silicon active layer) 4.

It is possible to fabricate the SOI wafer 1 by SIMOX (Separation by Implanted Oxygen) method or the like. According to the SIMOX method, oxygen ions of high concentration are implanted into a single-crystal silicon wafer substrate, and at the same time the single-crystal silicon wafer substrate is annealed under a high temperature. This allows the buried silicon oxide layer (BOX layer 3) to be formed at a predetermined depth from a surface of the single-crystal silicon wafer substrate. In the SIMOX method, a layer formed between the buried silicon oxide layer (BOX layer 3) and the surface of the single-crystal silicon wafer substrate serves as the active layer 4.

The SOI wafer 1 shown in FIG. 3(a) is processed as follows so that the single-crystal silicon IC 21 is fabricated.

Figure 3B:
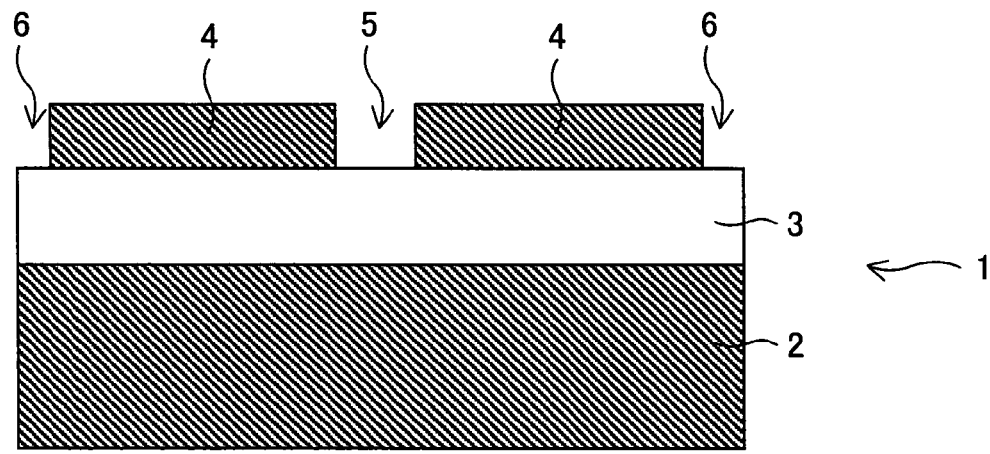

First, as shown in FIG. 3(b), grooves 5 and 6 are formed by removing the active layer 4 on the buried silicon oxide layer 3. The groove 6 is formed for causing desired number of single-crystal silicon ICs 21 to be formed on the SOI wafer 1. The groove 5 is formed for causing elements to be separated from one another in each of the single-crystal silicon ICs 21 to an element and an adjacent element, respectively in the single-crystal silicon IC 21. Note that the forming of the desired number of single-crystal silicon ICs 21 and the separating of the elements in each of single-crystal silicon ICs 21 are simultaneously carried out. Concretely, the grooves 5 and 6 are formed as follows. Resist is applied on the SOI wafer 1, and then patterned by photo lithography so as to cover regions other than the grooves 5 and 6. Thereafter, the SOI wafer 1 thus patterned is subject to an isotropic etching such as RIE (Reactive Ion Etching). The etching is carried out with respect to silicon up to such a etching depth that can reach the BOX layer 3.

Figure 3C:
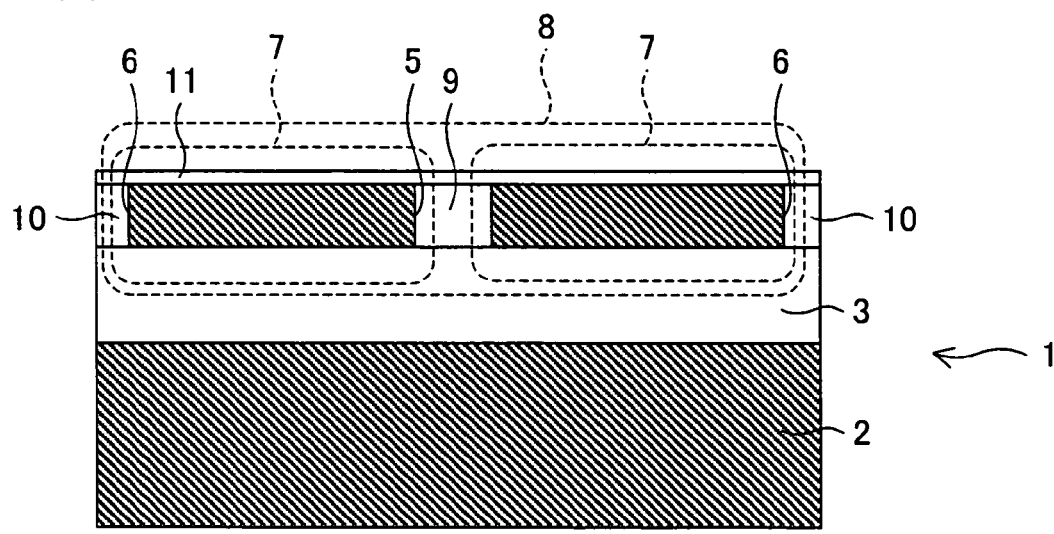

Next, as shown in FIG. 3(c), silicon dioxide, which is an oxide, is deposited in the grooves 5 and 6 while using a gas such as TEOS (Tetra Ethyl ortho silicate; $Si(OC_2H_5)_4$). Here, the silicon dioxide deposited in the groove 5 is referred to as silicon dioxide 9, and the silicon dioxide deposited in the groove 6 is referred to as silicon dioxide 10. This allows the forming of the desired number of single-crystal silicon ICs 21 and the separating of the elements in each of single-crystal silicon ICs 21 to be simultaneously carried out.

The silicon dioxide 9 and 10 are so arranged as to touch the BOX layer 3 made of the silicon dioxide. As such, the single-crystal silicon IC 21 is covered, except for the surface thereof, with the silicon dioxide.

The present embodiment is not limited to the foregoing step. Alternatively, the forming of the desired number of single-crystal silicon ICs 21 and the separating of the elements in each of single-crystal silicon ICs 21 may be simultaneously carried out by (i) covering the regions other than the grooves 5 and 6 with silicon nitride, and (ii) carrying out LOCOS (Local Oxidation of Silicon).

Next, in a thermal oxidation furnace (diffusion furnace), thermal oxidation is carried out with respect to the regions where the grooves 5 and 6 are formed. The thermal oxidation is dry $O_2$ oxidation, and the temperature in the furnace is substantially 1050° C. The oxidation in this case may be pyrogenic oxidation.

Further, the silicon nitride no longer required is removed by dry etching. Note that it is important to carry out the oxidation so that separated oxide films of the BOX layer 3 and the single-crystal silicon IC 21 substantially have a continuity.

Then, as shown in FIG. 3(c), a gate oxide film 11 of approximately 5 nm to 30 nm is formed by the thermal oxidation on a top surface of the SOI wafer 1. The gate oxide film 11 is also made of the silicon dioxide. This allows every surface of the single-crystal silicon IC 21 to be coated with the oxide (silicon dioxide).

Figure 4A:
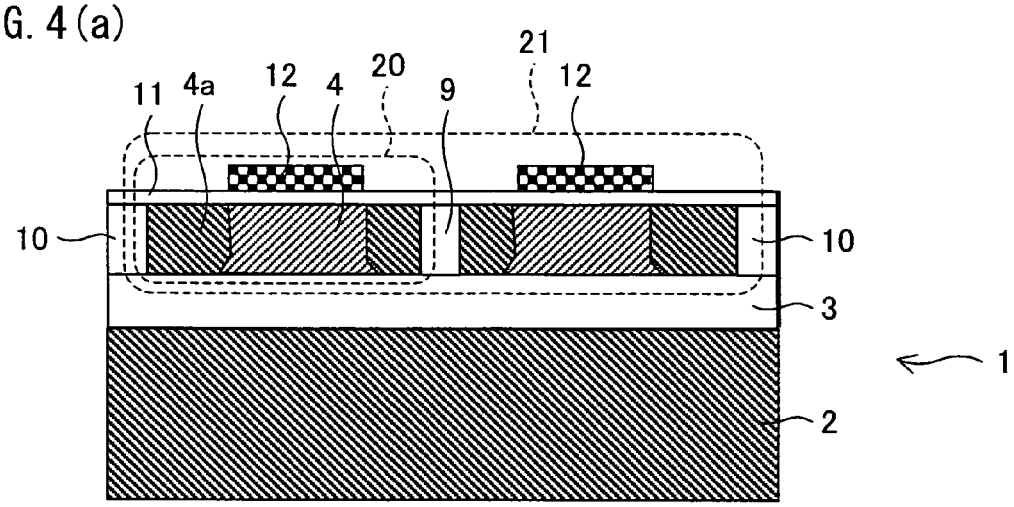
FIG. 4(a) and FIG. 4(b) are diagrams showing steps of fabricating the single-crystal silicon integrated circuits.

Next, a gate electrode 12 is formed on the gate oxide film 11 as shown in FIG. 4(a), with the use of a conventional LSI fabrication process. In this case, usually, a polysilicon film or a tungsten silicide film that can become the gate electrode 12 is formed on the gate oxide film 11. Then the gate electrode 12 is patterned by the photo lithography. It is easy to achieve a micro-fabrication of 0.5 μm or less by using equipment for fabricating an LSI.

Then, phosphorus or boron is implanted, in a self-aligning manner, in regions 4a where a source section and a drain section are formed, then activated by a thermal treatment at about a temperature of 1000° C. An LDD (Lightly Doped Drain) or the like is formed as needed. Note that it is necessary that a depth of the silicon active region be 200 nm or less, ideally 50 nm or less, in view of short channel effect of transistors.

Thus, formed are field effect transistors 20, which are the elements in the single-crystal silicon IC 21.

Figure 4B:
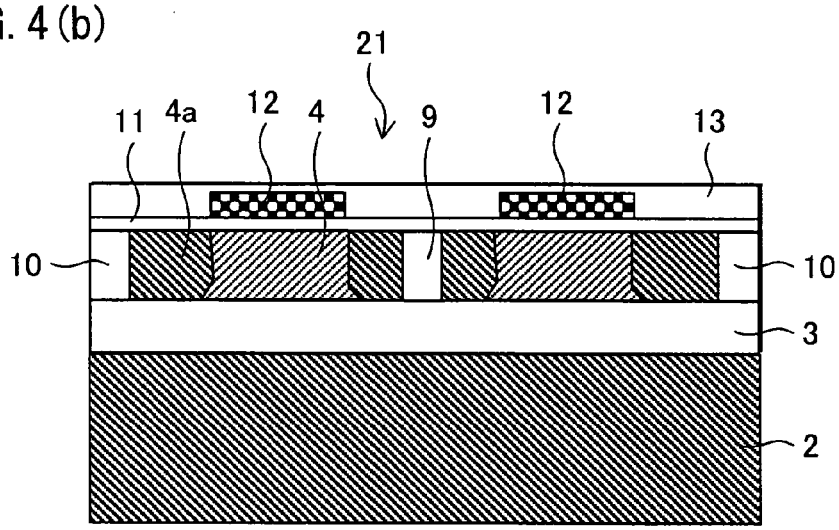

Then, an interlayer insulating film 13 of approximately 300 nm is formed as shown in FIG. 4(b), and levelled by CMP (Chemical Mechanical Polishing) method, so that the single-crystal silicon IC 21 is completed. The levelling may be by SOG (Spin On Glass) method or other methods, other than the CMP method. However, it is preferable to use the CMP method or the SOG method, both used in a typical semiconductor process, rather than using a mechanical polishing. This is because it is not desirable that the single-crystal silicon IC 21 is affected by the levelling process.

Meanwhile, an insulating substrate 101 (see FIG. 1) having a plane surface and a high deformation point is prepared, apart from the single-crystal silicon IC. The insulating substrate 101 is, for example, 1737 glass substrate produced by Corning. Note that the insulating substrate 101 in FIG. 1 is coated with the oxide film 102 of approximately 100 nm. However, the insulating substrate 101 may be without the oxide film 102.

Generally, when bonding the insulating substrate with a substrate, having a single-crystal silicon IC, whose surface has been subjected to oxidation process without an adhesive agent, it is very important what degree of cleaning and what degree of activity each surface of the single crystal silicon IC and the insulating substrate has.

As such, in order to obtain the surface which is appropriately cleaned and appropriately activated, each of the insulating substrate 101 and the single-crystal silicon IC 21 cut out from the wafer 1 is cleaned with a liquid called SC1 liquid, and then dried, prior to the bonding of them.

The SC1 liquid is prepared by mixing commercially-available ammonia water (NH$_4$OH: 30%), hydrogen peroxide solution (H$_2$O$_2$: 30%), and pure water (H$_2$O). For example, the above listed water and solution are mixed at a ratio of NH$_4$OH:H$_2$O$_2$:H$_2$O=5:12:60. The liquid temperature is a room temperature. The cleaning is carried out by soaking the single-crystal silicon IC 21 and the insulating substrate 101 into the SC1 liquid for 5 minutes. It is preferable to avoid soaking the single-crystal silicon IC 21 and the insulating substrate 101 into the SC1 liquid for a long time. This is because the ammonia water etches the surface of the silicon oxide.

The single-crystal silicon IC 21 and the insulating substrate 101 are then cleaned using flowing pure water (specific resistance of 10 MΩ cm or more) for 10 minutes, and is promptly dried using a spin dryer, or the like. After the cleaning and drying process, the single-crystal silicon IC 21 and the insulating substrate 101 are spontaneously bonded with each other, by bringing the respective surfaces of the single-crystal silicon IC 21 and the insulating substrate 101 together, and slightly pressing against each other.

Van der waals force, electrode duplex, and hydrogen bonding respectively contribute to the bonding of the single-crystal silicon IC 21 with the insulating substrate 101, without an adhesive agent. As such, it is easier to bond two substrates with each other, when each of the surfaces of the two substrates has a similar balance of the above three contributions.

After the single-crystal silicon IC 21 and the insulating substrate 101 are spontaneously bonded, a force, for bonding the single-crystal silicon IC 21 with the insulating substrate 101, is reinforced by a thermal treatment such as an annealing in an electric furnace at a temperature of 450° C. to 600° C., or a lamp annealing.

Then, a top portion of the BOX layer 3 in the single-crystal silicon IC 21 is etched by using a halogen gas including fluoride such as CIF$_3$. It is known that the halogen gas including fluoride has such a selection ratio causing a large difference between an etching rate with respect to the silicon and an etching rate with respect to the silicon dioxide. This causes only the silicon to be etched, and not the silicon dioxide.

Note that the etching may be carried out before the thermal treatment.

As illustrated in FIG. 4(a), for example, in the single-crystal silicon IC 21 described above, the silicon dioxide (the silicon dioxide 10 for causing the separation of the integrated circuits from one another, and the silicon dioxide 10 for causing the separation of the elements from one another) is formed in the region between the single-crystal silicon ICs 21, and in the region where the elements are separated from one another in each of the single-crystal silicon ICs 21. The silicon dioxide 10 is so formed as to reach the BOX layer 3 of the wafer 1. Therefore, the single-crystal silicon IC 21 cut out from the wafer 1 has the active region which is surrounded by the silicon dioxide.

As such, the halogen gas including the fluoride does not etch the active layer 4 (i.e., an active region for a thin film device such as a field effect transistor) formed in the single-crystal silicon IC 21. A polishing of silicon may be carried out prior to the etching so that the time required to carry out the etching is shortened. The polishing will be carried out by the CMP method, the MRF method, etching or the like, before the single-crystal silicon ICs are cut out from a semiconductor wafer.

Through the steps described above, completed is the semiconductor device shown in FIG. 1 in which (i) a desired number of single-crystal silicon ICs 21 are formed on the insulating substrate 101, and (ii) the oxide (silicon dioxide) coats every surface of the single-crystal silicon IC 21.

The foregoing description deals with the case where only the single-crystal silicon ICs 21 are formed on the insulating substrate 101. However, with the present invention, it is easy to obtain the insulating substrate 101, as shown in FIG. 5, on which the single-crystal silicon ICs 21 and the non-single crystal silicon transistors 31 coexist.

For example, as shown in FIG. 1, the single-crystal silicon IC 21 is bonded with the insulating substrate 101, and then the silicon layer 2 is removed by the etching. Then, using an excimer laser beam, SLS (Sequential Lateral Solidification) method is carried out with respect to a region of the insulating substrate 101 which is different from the region where the single-crystal silicon IC 21 is bonded, so that only a surface of amorphous silicon film forms poly-crystal. It should be noted that the region of the insulating substrate 101 where the single-crystal silicon IC 21 is bonded is kept from being exposed to the excimer laser beam.

Then, in a non-single-crystal silicon integrated circuit 31 (Hereinafter referred to as non-single-crystal silicon IC), a film of a wiring metal is formed (not shown) and patterned after carrying out the steps of forming a gate insulating film, a gate electrode film, an interlayer insulating film, and a contact hole (not shown).

Figure 5:
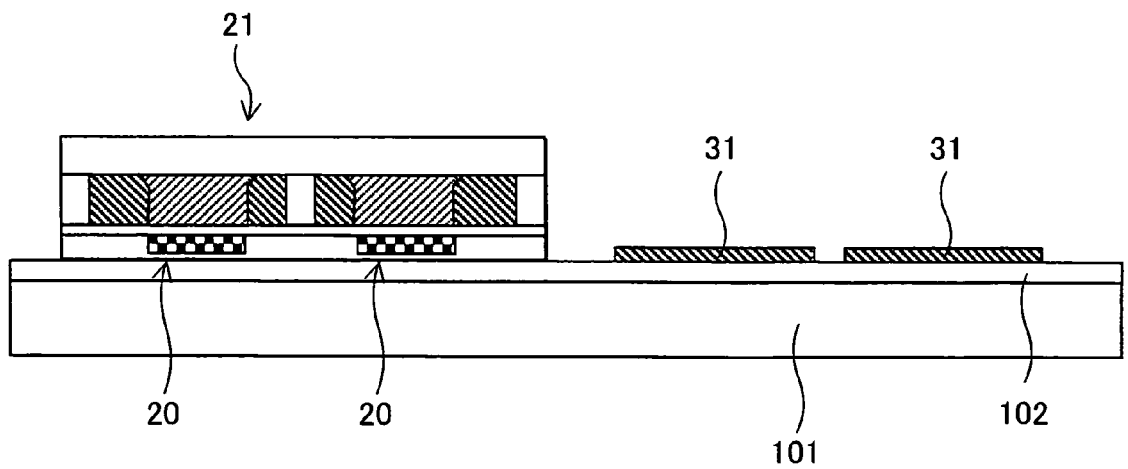
FIG. 5 shows another embodiment in accordance with the present invention, and is a schematic cross sectional view showing a main part of a semiconductor device.

The steps described above allows the formation of the semiconductor device, as shown in FIG. 5, in which the single-crystal silicon IC 21 and the non-single-crystal silicon IC 31 coexist.

As described, in a semiconductor device of the present invention, in which a silicon IC made of a single-crystal silicon thin film is formed on an insulating substrate, the silicon IC made of the single-crystal silicon thin film is formed so as to be surrounded by an oxide.

The non-single-crystal silicon IC 31 is fabricated before or after the single-crystal silicon IC 21 is fabricated.

Further, in the semiconductor device of the present invention in which a single-crystal silicon IC and a non-single-crystal silicon IC coexist on an insulating substrate, the single-crystal silicon IC is formed so as to be surrounded by an oxide.

A desired number of single-crystal silicon ICs having the arrangement are formed on the SOI (Silicon On Insulator) substrate including a buried oxide film (BOX layer), and a single-crystal silicon layer on the BOX layer. The single-crystal silicon ICs are separated from each other by an oxide which has such a depth that a continuity of the BOX layer and the oxide is maintained.

In a method of the present invention, for fabricating a semiconductor device, in which single-crystal silicon ICs each surrounded by the oxide film are formed on the insulating substrate, a predetermined number of single-crystal silicon ICs are formed on a SOI wafer. A separation of the single-crystal silicon ICs and a separation of elements in each of the single-crystal silicon ICs are simultaneously carried out by the oxidation of the silicon. Then, the single-crystal silicon ICs are cut out from the SOI wafer. The single-crystal silicon IC is bonded with the insulating substrate in a surface on a side of the single-crystal silicon thin film with respect to the BOX layer via the oxide film, or is bonded, at room temperature, with the insulating substrate whose surface is not coated with the oxide film. The single-crystal silicon IC and the insulating substrate thus bonded undergo a thermal treatment at a temperature of 400° C. (preferably at a temperature of 600° C. or higher), and undergo the etching and/or polishing so that the BOX layer is exposed. Note that the etching may be carried out before the thermal treatment.

In a method of the present invention, for fabricating a semiconductor device, in which single-crystal silicon ICs each surrounded by the oxide film are formed on the insulating substrate, a predetermined number of single-crystal silicon ICs are formed on a SOI wafer. Then, first and second grooves, each having such a depth as to reach the BOX layer, are formed by carrying out the etching with respect to (i) a region, between the adjacent single-crystal silicon ICs, which will become the first groove, and (ii) a region, between adjacent elements in each of the single-crystal silicon ICs, which will become the second groove. The first groove and the second groove are respectively filled with the silicon dioxide, so as to separate the single-crystal silicon ICs from one another, and so as to separate the elements from one another. Then, the single-crystal silicon ICs are cut out from the SOI wafer. The single-crystal silicon IC is bonded with the insulating substrate in a surface on a side of the single-crystal silicon thin film with respect to the BOX layer via the oxide film, or is bonded, at room temperature, with the insulating substrate whose surface is not coated with the oxide film. The single-crystal silicon IC and the insulating substrate thus bonded undergo a thermal treatment at a temperature of 400° C. (preferably at a temperature of 600° C. or higher), and undergo the etching so that the BOX layer is exposed.

With the configuration of the present invention, it is possible to easily bond the insulating substrate with the single-crystal silicon IC via the oxide film without any adhesive agent. This is because a thermal treatment is carried out after the insulating substrate and the single-crystal silicon IC are bonded with each other, via the oxide film.

Further, it is not necessary to implant the hydrogen ions or the like for fabricating the single-crystal silicon IC on the insulating substrate. This allows a formation of an integrated circuit with an undamaged active layer, by transferring.

It is possible to improve a property of a transistor whose active region is not damaged, as compared to a transistor whose active region is damaged. Namely, it is possible to realize a high mobility, a low threshold, and a steep subthreshold characteristic.

Further, it is possible to restrain nonuniformity of the property of the transistor. This improves a degree of integration of transistors for a given area.

Further, the active region of the transistor is protected against the halogen gas including the fluoride, which is used for removing the silicon under the BOX layer. This is because the active region of the single-crystal silicon IC is surrounded by the oxidation film.

Further, it is possible to simultaneously separate the single-crystal silicon ICs and separate the elements therein. As such, no additional complicating step is necessary. This contributes to an improvement in the yield.

It should be noted that the present embodiment deals with the case where the SIMOX method is utilized for fabricating the SOI wafer 1. However, the present invention is not limited to such a method, and the SOI wafer 1 may be fabricated by ELTRAN (Epitaxial Layer Transfer) method disclosed, for example, in Tokukaihei 7-235651 (published on Sep. 5, 1995), or the like. The ELTRAN method is a method for separating a single-crystal silicon layer from a porous silicon layer through the steps of (i) forming an oxide film layer, the porous silicon layer, and an epitaxial silicon layer on a silicon substrate, and then (ii) bonding the silicon substrate with a handling wafer.

Embodiment 2

Another embodiment of the present invention is described as follows.

Figure 6:
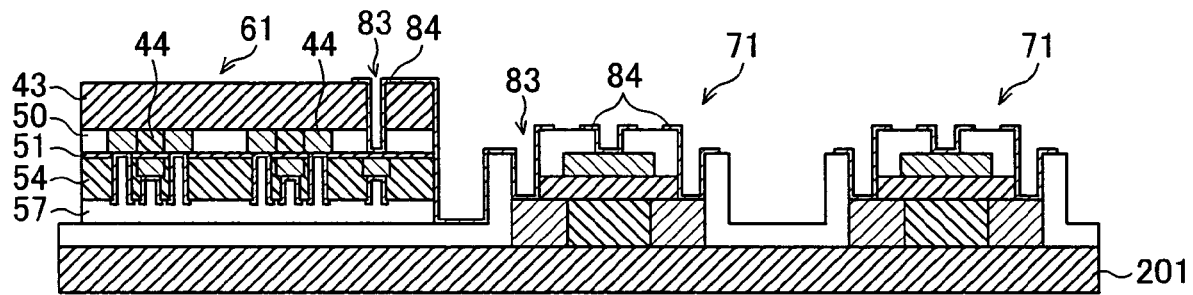
FIG. 6 shows another embodiment in accordance with the present invention, and is a schematic cross sectional view showing a main part of a semiconductor device.
Figure 7:
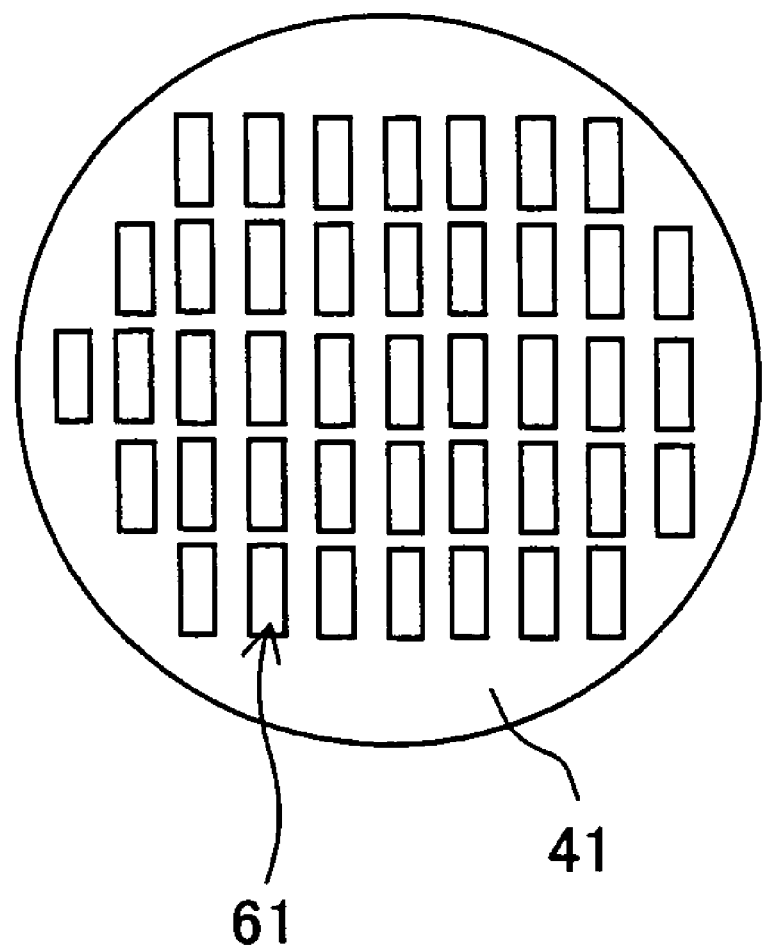
FIG. 7 is a schematic plane view showing an SOI wafer having single-crystal silicon integrated circuits shown in FIG. 6.

A semiconductor device of the present invention is so arranged as shown in FIG. 6 that a single-crystal silicon integrated circuit (Hereinafter referred to as single-crystal silicon IC) 61 and a non-single-crystal silicon integrated circuit (Hereinafter referred to as non-single-crystal silicon IC) 71 are bonded to an insulating substrate 201 made of a glass substrate, via an oxide film 202 made of silicon dioxide. Such a single-crystal silicon IC 61 is cut out from an SOI (Silicon On Insulator) wafer 41 shown in FIG. 7. FIG. 7 is a plane view showing the SOI wafer 41 on which the single-crystal silicon IC 61 is formed. Further, before or after the single-crystal silicon IC 61 is formed, the non-single-crystal silicon IC 71 is formed.

The following describes a method for fabricating the semiconductor device having the foregoing configuration, with reference to FIG. 8(a) through FIG. 8(i) showing steps of fabricating the single-crystal silicon IC 61.

First described is the SOI wafer 41 on which the single-crystal silicon IC 61 is formed.

As shown in FIG. 8(a), the SOI wafer 41 includes three layers, i.e., a silicon layer 42, a BOX layer (silicon oxide film (Buried Oxide)) 43, and an active layer (silicon active layer) 44.

It is possible to fabricate the SOI wafer 41 by SIMOX (Separation by Implanted Oxygen) method or the like. According to the SIMOX method, oxygen ions of high concentration are implanted into a single-crystal silicon wafer substrate, and at the same time the single-crystal silicon wafer substrate is annealed under a high temperature. This allows the buried silicon oxide layer (BOX layer 43) to be formed at a predetermined depth from a surface of the single-crystal silicon wafer substrate. In the SIMOX method, a layer formed between the buried silicon oxide layer (BOX layer 43) and the surface of the single-crystal silicon wafer substrate serves as the active layer 44.

The SOI wafer 41 shown in FIG. 8(*a*) is processed as follows so that the single-crystal silicon IC 61 is fabricated.

First, as shown in FIG. 8(*b*), grooves 45 and 46 are formed by removing the active layer 44 on the buried silicon oxide layer 43. The groove 46 is formed for causing desired number of single-crystal silicon ICs 61 to be formed on the SOI wafer 41. The groove 46 is formed for causing desired number of single-crystal silicon ICs 61 to be formed on the SOI wafer 41. The groove 45 is formed for causing elements to be separated from one another in each of the single-crystal silicon ICs 61 to an element and an adjacent element, respectively in the single-crystal silicon IC 61. Note that the forming of the desired number of single-crystal silicon ICs 61 and the separating of the elements in each of single-crystal silicon ICs 61 are simultaneously carried out. Concretely, the grooves 45 and 46 are formed as follows. Resist is applied on the SOI wafer 41, and then patterned by photo lithography so as to cover regions other than the grooves 45 and 46. Thereafter, the SOI wafer 41 thus patterned is subject to an isotropic etching such as RIE (Reactive Ion Etching). The etching is carried out with respect to silicon up to such a etching depth that can reach the BOX layer 43.

Next, as shown in FIG. 8(*c*), silicon dioxide 50, which is an oxide, is deposited in the grooves 45 and 46 while using a gas such as TEOS (Tetra Ethyl ortho silicate; $Si(OC_2H_5)_4$). This allows the separating of the desired number of single-crystal silicon ICs and the separating of the elements in each of single-crystal silicon ICs to be simultaneously carried out.

The silicon dioxide 50 is so arranged as to touch the BOX layer 43 made of the silicon dioxide. As such, the single-crystal silicon IC 61 is covered, except for the surface thereof, with the silicon dioxide.

The present embodiment is not limited to the foregoing step. Alternatively, the forming of the desired number of single-crystal silicon ICs 61 and the separating of the elements in each of single-crystal silicon ICs 61 may be simultaneously carried out by (i) covering the regions other than the grooves 45 and 46 with silicon nitride, and (ii) carrying out LOCOS (Local Oxidation of Silicon).

Next, in a thermal oxidation furnace (diffusion furnace), thermal oxidation is carried out with respect to the regions where the grooves 45 and 46 are formed. The thermal oxidation is dry $O_2$ oxidation, and the temperature in the furnace is substantially 1050° C. The oxidation in this case may be pyrogenic oxidation. Further, the silicon nitride no longer required is removed by dry etching. Note that it is important to carry out the oxidation so that separated oxide films of the BOX layer 43 and the single-crystal silicon IC 61 substantially have a continuity.

Then, as shown in FIG. 8(*c*), a gate oxide film 51 of approximately 5 nm to 30 nm is formed by the thermal oxidation on a top surface of the SOI wafer 41. The gate oxide film 51 is also made of the silicon dioxide. This allows every surface of the single-crystal silicon IC 61 to be coated with the oxide (silicon dioxide).

Next, a gate electrode 52 is formed on the gate oxide film 11 as shown in FIG. 8(*d*), with the use of a conventional LSI fabrication process. In this case, usually, a polysilicon film or a tungsten silicide film that can become the gate electrode 52 is formed on the gate oxide film 11. Then the gate electrode 52 is patterned by the photo lithography. It is easy to achieve a micro-fabrication of 0.5 µm or less by using equipment for fabricating an LSI.

Then, as shown in FIG. 8(*e*), phosphorus or boron is implanted, in a self-aligning manner, in regions 53 where a source section and a drain section are formed, then activated by a thermal treatment at about a temperature of 1000° C. An LDD (Lightly Doped Drain) or the like is formed as needed. Note that it is necessary that a depth of the silicon active region be 200 nm or less, ideally 50 nm or less, in view of short channel effect of transistors. Thus, formed are field effect transistors 60, which are the elements in the single-crystal silicon IC 61.

Then, an interlayer insulating film 54 of approximately 300 nm is formed as shown in FIG. 8(*f*), and levelled by CMP (Chemical Mechanical Polishing) method. The levelling may be by SOG (Spin On Glass) method or other methods, other than the CMP method. However, it is preferable to use the CMP method or the SOG method, both used in a typical semiconductor process, rather than using a mechanical polishing. This is because it is not desirable that the single-crystal silicon IC 61 is affected by the levelling process.

Then, a contact 55 is formed in a groove formed as shown in FIG. 8(*g*), by carrying out dry etching and/or wet etching. Then, a conductive metal wiring 56 is formed on a surface of the contact 55 as shown in FIG. 8(*h*). It is preferable that the metal wiring 56 be made of a heat-resistant material such as Ti. This is because a thermal treatment is carried out later, at a temperature of 400° C. to 600° C. However, the material of the metal wiring is not limited to Ti.

By forming the metal wiring 56 on the single-crystal silicon IC 61 before the single crystal silicon IC 61 is bonded with the insulating substrate, it is possible to keep designing rules for the metal wiring layout to the minimum. This allows a reduction in the layout and an improvement in the operation speed.

Then, an interlayer insulating film 57 of approximately 300 nm is formed as shown in FIG. 8(*i*), and levelled by the CMP method, the SOG method, or other method. It is preferable to use the CMP method or the SOG method in this process as well, rather than using the mechanical polishing.

Figure 9:
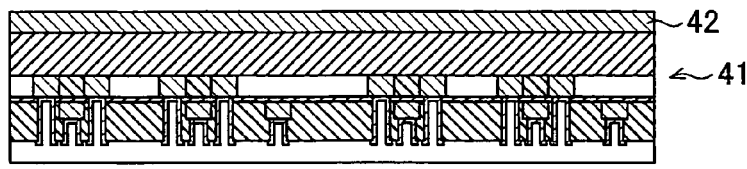
FIG. 9(a) through FIG. 9(f) show an embodiment in accordance with the present invention.
Figure 9:
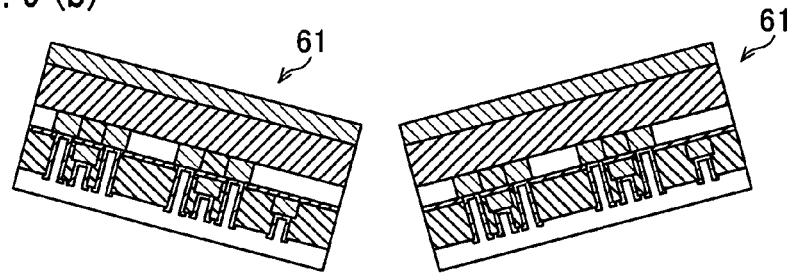
Figure 9:
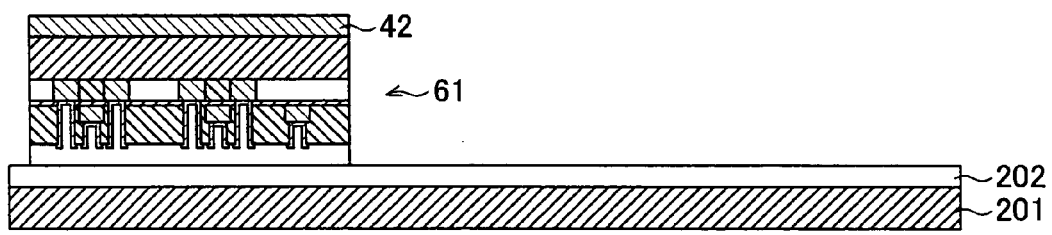
Figure 9:
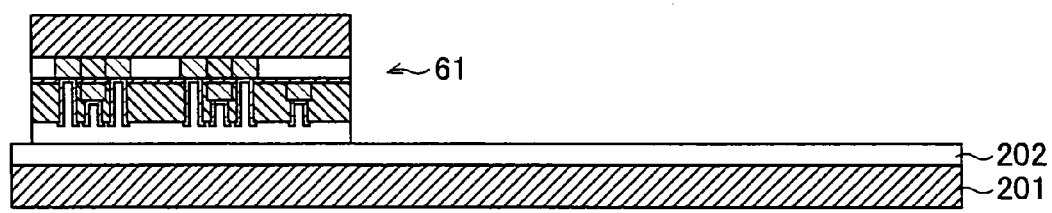
Figure 9:
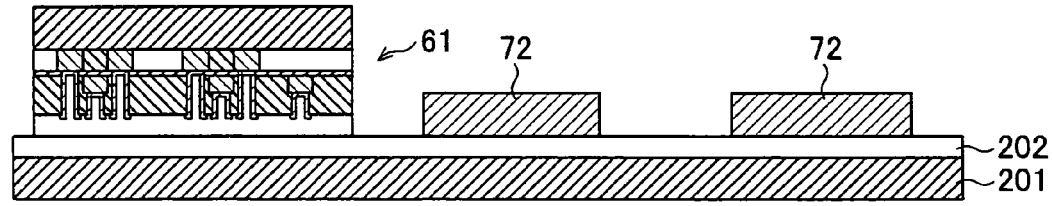
Figure 9:
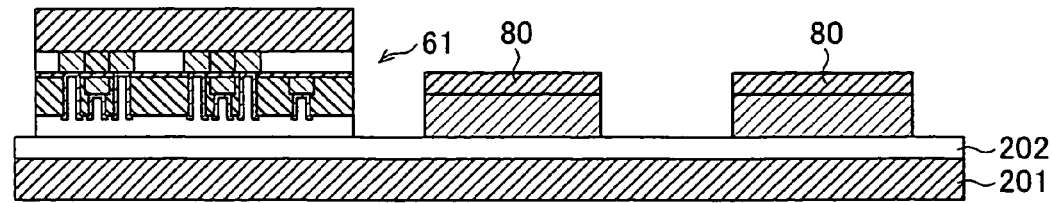

Note that, a thinning process may be carried out in advance with respect to a surface opposite to a levelled surface of the wafer, by using MRF (Magnetorheological Finishing) or the like (see FIG. 9(*a*)). By carrying out the thinning process in advance, it is possible to reduce time needed for later carrying out a thinning process by etching. This allows an improvement in yield of productivity. In other words, since it is difficult for the mechanical polishing to accurately control the thickness of the silicon layer 42, the silicon layer 42 ultimately needs to be removed in a post-process by carrying out the etching using the halogen gas including the fluoride. On the contrary, it is technically difficult to carry out the mechanical polishing with respect to the single-crystal silicon IC 61 which has been cut out from the SOI wafer 41. For this reason, the thinning process is carried out with respect to the silicon layer 42 to such a degree that the mechanical polishing can be carried out, and after cutting out the silicon layer 42 thus thinned from the SOI wafer 41, the etching using the halogen gas including the fluoride is carried out with respect to the silicon layer 42 thus cut out, so that the silicon layer 42 is accurately removed in a short time.

Then, as shown in FIG. 9(b), the single-crystal silicon ICs are cut out from the wafer by dicing or the like. Thus, each of the single-crystal silicon IC thus cut out is coated with the oxide film.

Meanwhile, an insulating substrate 201 (see FIG. 6) having a plane surface and a high deformation point is prepared, apart from the single-crystal silicon IC 61. The insulating substrate 201 is, for example, 1737 glass substrate produced by Corning. Note that the insulating substrate 201 in FIG. 6 is coated with the oxide film 202 of approximately 100 nm. However, the insulating substrate 201 may be without the oxide film 202.

Generally, when bonding the insulating substrate with a substrate, having a single-crystal silicon IC, whose surface has been subjected to oxidation process without an adhesive agent, it is very important what degree of cleaning and what degree of activity each surface of the single crystal silicon IC and the insulating substrate has.

As such, in order to obtain the surface which is appropriately cleaned and appropriately activated, each of the insulating substrate 201 and the single-crystal silicon IC 61 cut out from the wafer 41 is cleaned with a liquid called SC1 liquid, and then dried, prior to the bonding of them.

The SC1 liquid is prepared by mixing commercially-available ammonia water ($NH_4OH$: 30%), hydrogen peroxide solution ($H_2O_2$: 30%), and pure water ($H_2O$). For example, the above listed water and solution are mixed at a ratio of $NH_4OH:H_2O_2:H_2O=5:12:60$. The liquid temperature is a room temperature. The cleaning is carried out by soaking the single-crystal silicon IC 61 and the insulating substrate 201 into the SC1 liquid for 5 minutes. It is preferable to avoid soaking the single-crystal silicon IC 61 and the insulating substrate 201 into the SC1 liquid for a long time. This is because the ammonia water etches the surface of the silicon oxide.

The single-crystal silicon IC 61 and the insulating substrate 201 are then cleaned using flowing pure water (specific resistance of 10 MΩcm or more) for 10 minutes, and is promptly dried using a spin dryer, or the like. After the cleaning and drying process, the single-crystal silicon IC 61 and the insulating substrate 201 are spontaneously bonded with each other, by bringing the respective surfaces of the single-crystal silicon IC 61 and the insulating substrate 201 together, and slightly pressing against each other (see FIG. 9(c)).

Van der waals force, electrode duplex, and hydrogen bonding respectively contribute to the bonding of the single-crystal silicon IC 61 with the insulating substrate 101, without an adhesive agent. As such, it is easier to bond two substrates with each other, when each of the surfaces of the two substrates has a similar balance of the above three contributions.

After the single-crystal silicon IC 61 and the insulating substrate 201 are spontaneously bonded, a force, for bonding the single-crystal silicon IC 61 with the insulating substrate 201, is reinforced by a thermal treatment such as an annealing in an electric furnace at a temperature of 450° C. to 600° C., or a lamp annealing.

Then, as shown in FIG. 9(d), a top portion of the BOX layer 43 in the single-crystal silicon IC 61 is etched by using the halogen gas including the fluoride such as $CIF_3$. It is known that the halogen gas including fluoride has such a selection ratio causing a large difference between an etching rate with respect to the silicon and an etching rate with respect to the silicon dioxide. This causes only the silicon (the silicon layer 42 which has been subject to the thinning process) to be etched, and not the silicon dioxide.

The present embodiment deals with the case where the etching is carried out after the thermal treatment. However, alternatively, after the single-crystal silicon IC 61 and the insulating substrate 201 are bonded with each other, it is possible to carry out the etching by using the halogen gas including the fluoride, before the thermal treatment for reinforcing the bonding force. It is, however, preferable that the etching be carried out after the thermal treatment. This is because the strength for bonding the single-crystal silicon IC 61 and the insulating substrate 201 is weak without carrying out the thermal treatment. This may cause the single-crystal silicon IC 61 to be peeled or misaligned by, for example, the transfer of the substrate which is carried out during the etching process.

As illustrated in FIG. 8(i), for example, in the single-crystal silicon IC 61 described above, the silicon dioxide 50 is formed in the region between the single-crystal silicon ICs 61, and in the region where the elements are separated from one another in each of the single-crystal silicon ICs 61. The silicon dioxide 50 is so formed as to reach the BOX layer 43 of the wafer 41. Therefore, the single-crystal silicon IC 61 cut out from the wafer 41 has the active region which is surrounded by the silicon dioxide.

As such, the halogen gas including the fluoride does not etch the active layer 44 (i.e., an active region for a thin film device such as a field effect transistor) formed in the single-crystal silicon IC 61. A polishing of silicon may be carried out prior to the etching so that the time required to carry out the etching is shortened. The polishing will be carried out by the MRF method or the like before the single-crystal silicon ICs are cut out.

Figure 10:
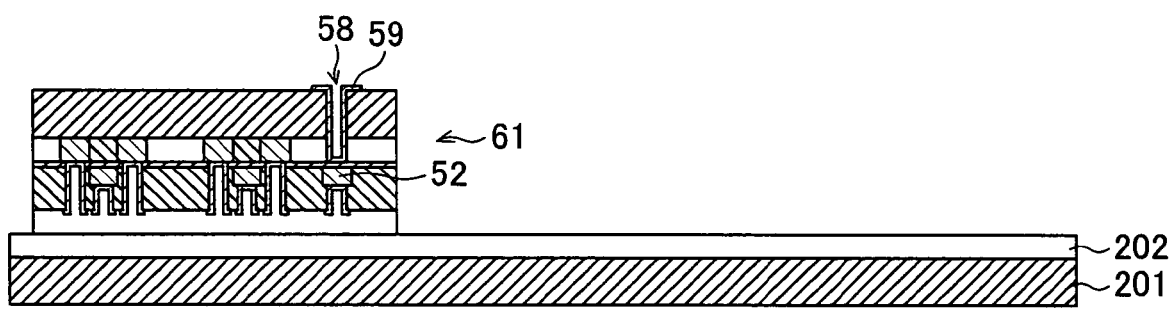
FIG. 10 shows an embodiment in accordance with the present invention, and is a schematic cross sectional view showing a main part of a semiconductor device.

Here, as shown in FIG. 10, a second contact 58 and a second metal wiring 59 are formed from a side of the BOX layer. The second contact 58 and the second metal wiring 59 are provided for electrically connecting the single-crystal silicon IC, which has been bonded with the insulating substrate, with an external circuit such as a non-single-crystal silicon IC. The present embodiment deals with the case where the second metal wiring 59 is connected via the gate electrode 52 of the single-crystal silicon IC. However, the second metal wiring 59 is not limited to such a case.

Through the steps described above, completed is the semiconductor device shown in FIG. 10 in which (i) a desired number of single-crystal silicon ICs 61 are formed on the insulating substrate 201, and (ii) the oxide (silicon dioxide) coats every surface of the single-crystal silicon IC 61.

In the case described above, only the single-crystal silicon IC 61 is formed on the insulating substrate 201. The following description deals with the case where the single-crystal silicon IC 61 and the non-single-crystal IC 71 coexist on a single same insulating substrate 201 (see FIG. 6).

For example, like the foregoing steps shown in FIG. 9(a) through FIG. 9(d), the insulating substrate 201 is bonded with the single-crystal silicon IC 61, which has been cut out from the SOI wafer 41 which has been fabricated in the step shown in FIG. 8(i), and then the silicon layer 42 is removed by the etching. Then, using an excimer laser beam, SLS (Sequential Lateral Solidification) method is carried out with respect to a region of the insulating substrate 201 which is different from the region where the single-crystal silicon IC 61 is bonded (see FIG. 9(e)), so that only a surface of amorphous silicon film forms poly-crystal. This allows the formation of a non-single-crystal silicon 72. It should be noted that the region of the insulating substrate 201 where the single-crystal silicon IC 61 is bonded is kept from being exposed to the excimer laser beam.

Figure 11:
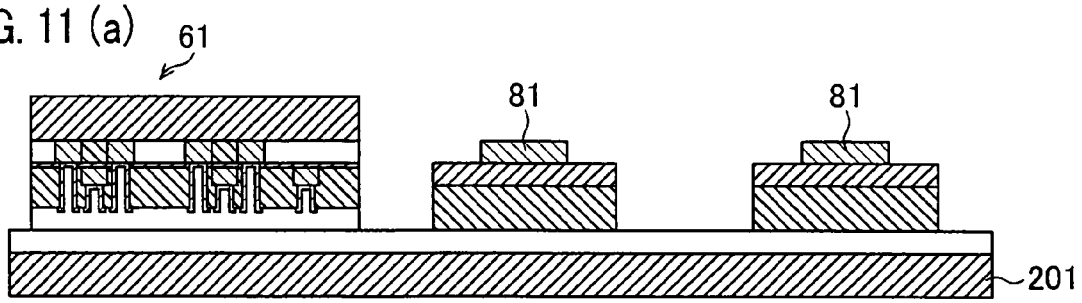
FIG. 11(a) through FIG. 11(e) show an embodiment in accordance with the present invention.
Figure 11:
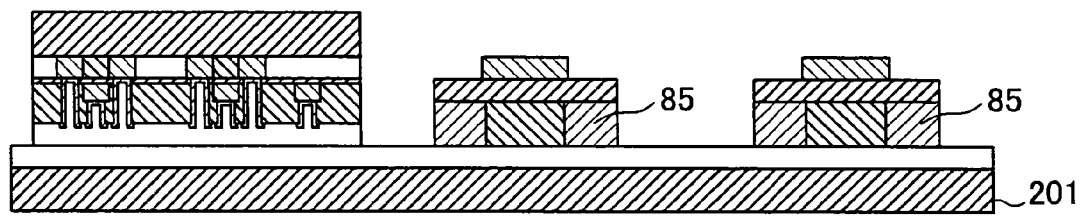
Figure 11:
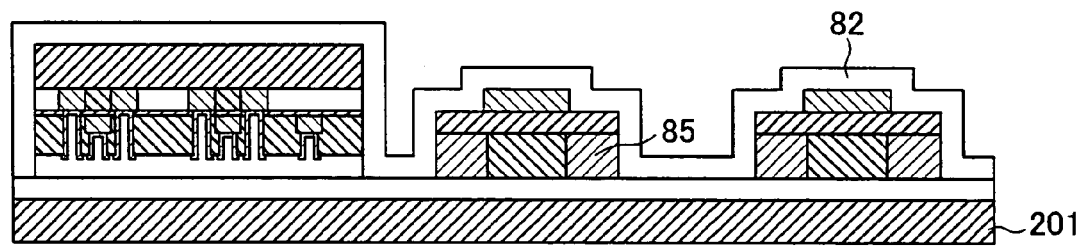
Figure 11:
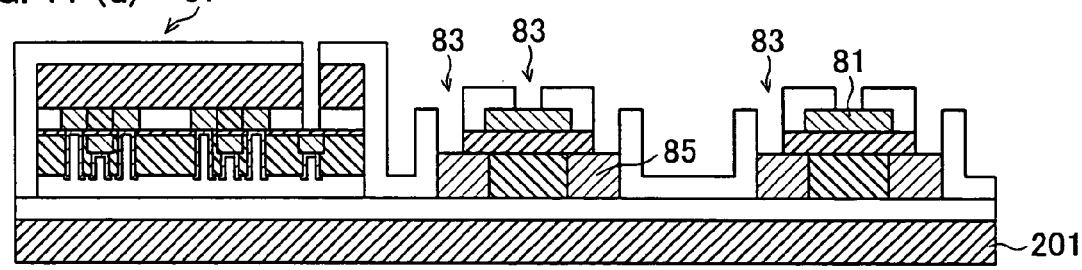
Figure 11:
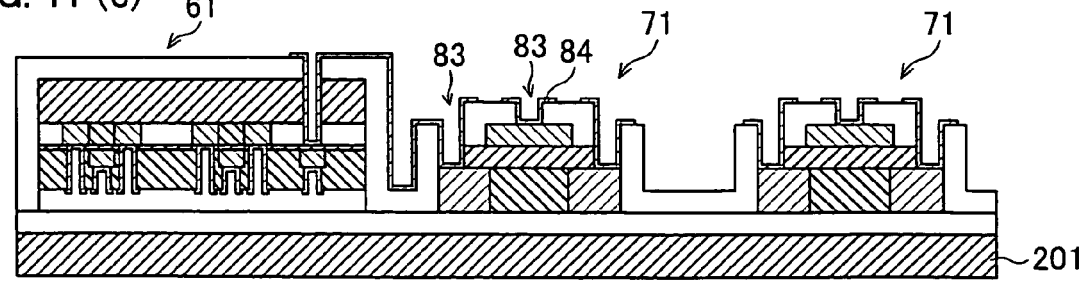

Then, as shown in FIG. 9(f), a gate insulating film 80 is formed for the non-single-crystal silicon IC 71, and the gate electrode film 81 is formed on a surface of the insulating film 80 as shown in FIG. 11(a). Then, as shown in FIG. 11(b), after an ion-implanted portion 85 is formed by implanting ions to an end part of the non-single-crystal silicon, an interlayer insulating film 82 is so formed as to cover the gate electrode film 81 as shown in FIG. 11(c), and a contact hole 83 is formed as shown in FIG. 11(c) such that the contact hole reaches the gate electrode film 81 or the implanted-portion 85. Then, as shown in FIG. 11(e), a wiring metal 84 is formed and patterned in the contact hole 83.

The steps described above allows the formation of the semiconductor device, as shown in FIG. 6, in which the single-crystal silicon IC 61 and the non-single-crystal silicon IC 71 coexist.

Although the non-single-crystal silicon IC 71 is formed after the single-crystal silicon IC 61 is formed, it is possible to form the non-single-crystal silicon IC 71 before the single-crystal silicon IC 61 is formed.

Figure 12:
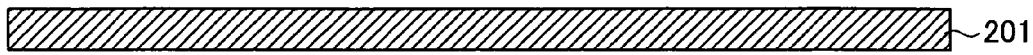
FIG. 12(a) through FIG. 12(i) show another embodiment in accordance with the present invention.
Figure 12:
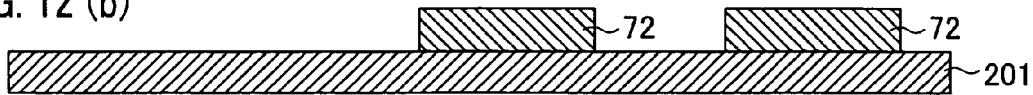
Figure 12:
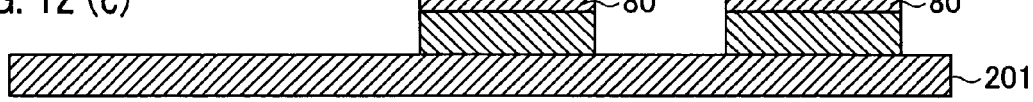
Figure 12:
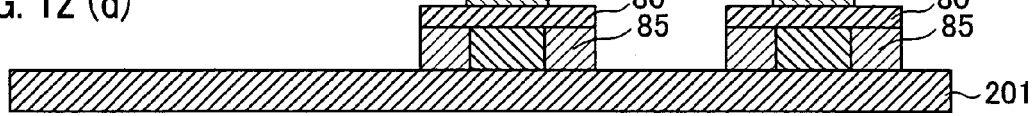
Figure 12:
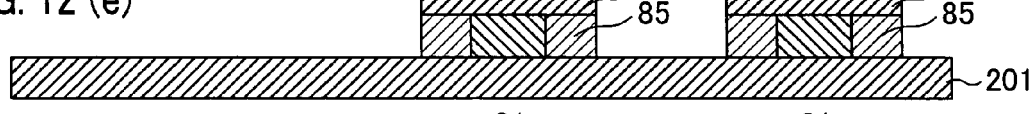
Figure 12:
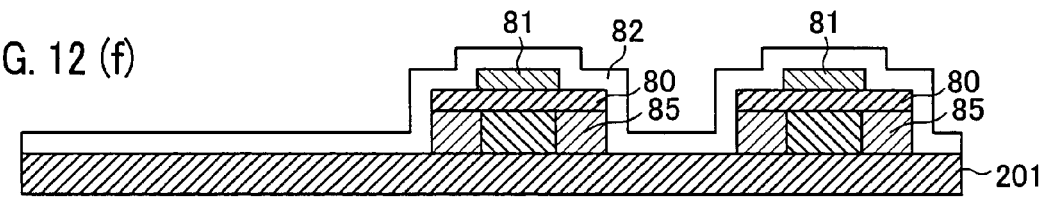
Figure 12:
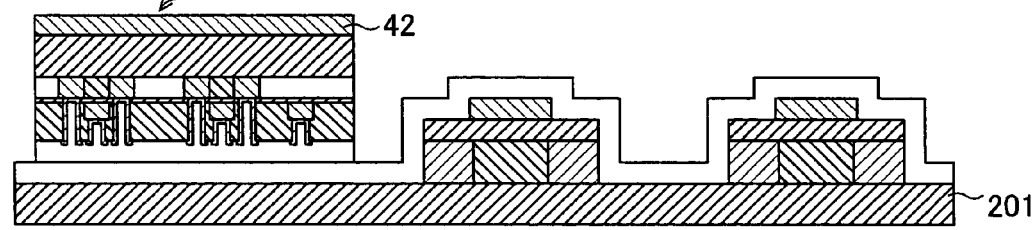
Figure 12:
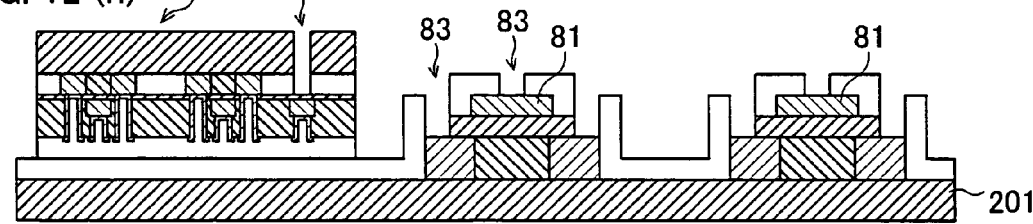
Figure 12:
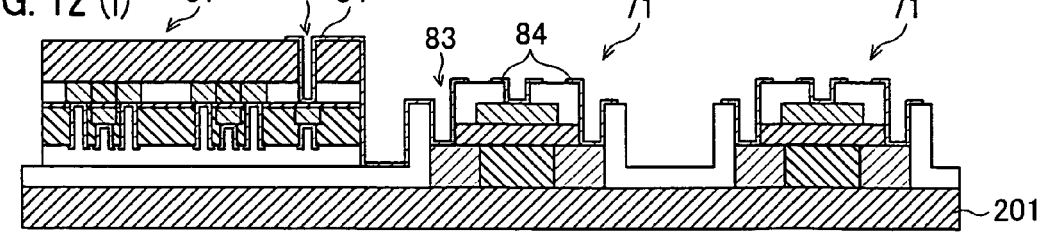

In such a case, the non-single-crystal 72 is formed on the insulating substrate 201 shown in FIG. 12(a) (see FIG. 12(b)). Then, as shown in FIG. 12(c), the gate insulating film 80 is formed for the non-single-crystal silicon IC 71, and the gate electrode film 81 is formed on the surface of the gate insulating film 80 as shown in FIG. 12(d). Then, as shown in FIG. 12(e), after an ion-implanted portion 85 is formed by implanting the ions to the end part of the non-single-crystal silicon 72, the interlayer insulating film 82 is so formed as to cover the gate electrode film 81 as shown in FIG. 12(f).

Then, the single-crystal silicon IC 61 (chip) is cut out from the SOI wafer 41, and is bonded with the insulating substrate 201 as shown in FIG. 12(g). Next, as shown in FIG. 12(h), the etching is carried out with respect to the silicon layer 42 to which the thinning process has been previously carried out. After that, the contact hole 83 is formed, such that the contact hole reaches the gate electrode film 81, the implanted-portion 85, or the gate electrode 52. Then, as shown in FIG. 12(i), a wiring metal 84 is formed and patterned in the contact hole 83.

The foregoing steps also allows the formation of the semiconductor device as shown in FIG. 6, in which the single-crystal silicon IC 61 and the non-single-crystal silicon IC 71 coexist.

As described, in a semiconductor device of the present invention, in which a silicon IC made of a single-crystal silicon thin film is formed on an insulating substrate, the silicon IC made of the single-crystal silicon thin film is formed so as to be surrounded by an oxide.

Further, in the semiconductor device of the present invention in which a single-crystal silicon IC and a non-single-crystal silicon IC coexist on an insulating substrate, the single-crystal silicon IC is formed so as to be surrounded by an oxide.

A desired number of single-crystal silicon ICs having the arrangement are formed on the SOI (Silicon On Insulator) substrate including a buried oxide film (BOX layer), and a single-crystal silicon layer on the BOX layer. The single-crystal silicon ICs are separated from each other by an oxide which has such a depth that a continuity of the BOX layer and the oxide is maintained.

In a method of the present invention, for fabricating a semiconductor device, in which single-crystal silicon ICs each surrounded by the oxide film are formed on the insulating substrate, a predetermined number of single-crystal silicon ICs are formed on a SOI wafer. A separation of the single-crystal silicon ICs and a separation of elements in each of the single-crystal silicon ICs are simultaneously carried out by the oxidation of the silicon. Then, the single-crystal silicon ICs are cut out from the SOI wafer. The single-crystal silicon IC is bonded with the insulating substrate in a surface on a side of the single-crystal silicon thin film with respect to the BOX layer via the oxide film, or is bonded, at room temperature, with the insulating substrate whose surface is not coated with the oxide film. The single-crystal silicon IC and the insulating substrate thus bonded undergo a thermal treatment at a temperature of 400° C. (preferably at a temperature of 600° C. or higher), and undergo the etching so that the BOX layer is exposed. Note that the etching may be carried out before the thermal treatment.

In a method of the present invention, for fabricating a semiconductor device, in which single-crystal silicon ICs each surrounded by the oxide film are formed on the insulating substrate, a predetermined number of single-crystal silicon ICs are formed on a SOI wafer. Then, first and second grooves, each having such a depth as to reach the BOX layer, are formed by carrying out the etching with respect to (i) a region, between the adjacent single-crystal silicon ICs, which will become the first groove, and (ii) a region, between adjacent elements in each of the single-crystal silicon ICs, which will become the second groove. The first groove and the second groove are respectively filled with the silicon dioxide, so as to separate the single-crystal silicon ICs from one another, and so as to separate the elements from one another. Then, the single-crystal silicon ICs are cut out from the SOI wafer. The single-crystal silicon IC is bonded with the insulating substrate in a surface on a side of the single-crystal silicon thin film with respect to the BOX layer via the oxide film, or is bonded, at room temperature, with the insulating substrate whose surface is not coated with the oxide film. The single-crystal silicon IC and the insulating substrate thus bonded undergo a thermal treatment at a temperature of 400° C. (preferably at a temperature of 600° C. or higher), and undergo the etching so that the BOX layer is exposed.

The present method is characterized by polishing, in advance, a surface of the SOI wafer which is opposite to a surface on which the single-crystal silicon IC is formed. As such, it is possible to reduce the time taken for the etching, and to improve the productivity.

With the configuration of the present invention, it is possible to easily bond the insulating substrate with the single-crystal silicon IC via the oxide film without any adhesive agent. This is because a thermal treatment is carried out after the insulating substrate and the single-crystal silicon IC are bonded with each other, via the oxide film.

Further, it is not necessary to implant the hydrogen ions or the like for fabricating the single-crystal silicon IC on the insulating substrate. This allows a formation of an integrated circuit with an undamaged active layer, by transferring.

It is possible to improve a property of a transistor whose active region is not damaged, as compared to a transistor whose active region is damaged. Namely, it is possible to realize a high mobility, a low threshold, and a steep subthreshold characteristic.

Further, it is possible to restrain nonuniformity of the property of the transistor. This improves a degree of integration of transistors for a given area. Further, the active region of the transistor is protected against the halogen gas including the fluoride, which is used for removing the silicon under the BOX layer. This is because the active region of the single-crystal silicon IC is surrounded by the oxidation film.

Further, it is possible to simultaneously separate the single-crystal silicon ICs and separate the elements therein. As such, no additional complicating step is necessary. This contributes to an improvement in the yield.

It should be noted that the present embodiment deals with the case where the SIMOX method is utilized for fabricating the SOI wafer 41. However, the present invention is not limited to such a method, and the SOI wafer 41 may be fabricated by ELTRAN (Epitaxial Layer Transfer) method disclosed, for example, in Tokukaihei 7-235651/1995 (Published on Sep. 5, 1995), or the like. The ELTRAN method is a method for separating a single-crystal silicon layer from a porous silicon layer through the steps of (i) forming an oxide film layer, the porous silicon layer, and an epitaxial silicon layer on a silicon substrate, and then (ii) bonding the silicon substrate with a handling wafer.

Further, a method of the present invention for fabricating a wafer may include the steps of: (A) forming an buried oxide layer on a silicon substrate; (B) forming a desired number of single-crystal silicon integrated circuits in an active layer on the buried oxide layer; (C) forming a first groove in a region where adjacent single-crystal silicon integrated circuits are separated from one another, and a second groove in a region where elements in each of the single-crystal silicon integrated circuits are separated from one another, each of the first and second grooves having such a depth that reaches the buried oxide layer; (D) filling an oxide simultaneously in the first and second grooves, so that (i) a separation of the single-crystal silicon integrated circuits, and (ii) a separation of elements in each of the single-crystal silicon integrated circuits are simultaneously carried out by using an oxide; (D) causing the single crystal silicon integrated circuits to be surrounded by the oxide.

The foregoing method allows obtaining of a wafer in which each of the single-crystal silicon integrated circuits is surrounded by the oxide. Further, as described above, by forming the first groove in the region where adjacent single-crystal silicon integrated circuits are separated from one another, and the second groove in the region where elements in each of the single-crystal silicon integrated circuits are separated from one another, each of the first and second grooves having such a depth that reaches the buried oxide layer, and filling the oxide simultaneously in the first and second grooves, and causing the single crystal silicon integrated circuits to be surrounded by the oxide, it is possible to separate the single crystal silicon integrated circuits from one another, and possible to separate from one another the elements in each of the single crystal silicon integrated circuits. This allows the simplification of the fabricating process, thereby avoiding a reduction of the yield.

Further, a method of the present invention for fabricating a semiconductor device which includes at least a single-crystal silicon integrated circuit on an insulating substrate may include the steps of: (A) forming a desired number of single-crystal silicon integrated circuits on a silicon active layer of a semiconductor wafer in which a buried oxide layer is formed on a silicon substrate; (B) forming a first groove in a region where adjacent single-crystal silicon integrated circuits are separated from one another, and a second groove in a region where elements in each of the single-crystal silicon integrated circuits are separated from one another, each of the first and second grooves having such a depth that reaches the buried oxide layer; (C) cutting out the single-crystal silicon integrated circuits from the semiconductor wafer after an oxide is simultaneously filled in the first groove and the second groove; (D) bonding the insulating substrate with a surface, opposite to a surface on which the buried oxide layer is formed, of the single-crystal silicon integrated circuit.

The foregoing method allows obtaining of a semiconductor device in which each of the single-crystal silicon integrated circuits is surrounded by the oxide. Further, as described above, by forming the first groove in the region where adjacent single-crystal silicon integrated circuits are separated from one another, and the second groove in the region where elements in each of the single-crystal silicon integrated circuits are separated from one another, each of the first and second grooves having such a depth that reaches the buried oxide layer, and filling the oxide simultaneously in the first and second grooves, and causing the single crystal silicon integrated circuits to be surrounded by the oxide, it is possible to separate the single crystal silicon integrated circuits from one another, and possible to separate from one another the elements in each of the single crystal silicon integrated circuits. This allows the simplification of the fabricating process, thereby avoiding a reduction of the yield.

Further, the method of the present invention for fabricating the semiconductor device may be such that (i) the strength of the bonding is improved by a heat treatment, after the single-crystal silicon integrated circuit is bonded with the insulating substrate, and (ii) before or after a heat treatment is carried out subsequently to the bonding of the single-crystal silicon integrated circuit with the insulating substrate, a thinning process is carried out up to the buried oxide layer.

Further, the method of the present invention for fabricating the semiconductor device, may include the steps of: (A) carrying out a thinning process by polishing or the like with respect to the semiconductor wafer, before the single-crystal silicon integrated circuit is cut out from the semiconductor wafer; (B) bonding the insulating substrate with the single-crystal silicon integrated circuit cut out from the semiconductor wafer after the thinning process; and (C) carrying out the thinning process, up to the buried oxide layer, with respect to a side of the single-crystal silicon integrated circuit opposite to a surface where the insulation substrate is bonded.

In other words, the thinning process is carried out with respect to the silicon layer up to certain degree before the single-crystal silicon integrated circuit is cut out from the wafer, and another thinning process is carried out by an etching using a gas or the like up to the buried oxide layer after cutting out the single-crystal silicon integrated circuit from the wafer. This is because it is technically difficult to carry out the mechanical polishing after the single-crystal silicon integrated circuit is cut out from the wafer; that is to say the single-crystal silicon integrated circuit is too small to polish individually, and it is not preferable to polish them individually in terms of tact.

With the foregoing method, it is possible to fabricate the single-crystal silicon integrated circuit on the insulating substrate in short time.

Further, it is possible to carry out the thinning process by polishing and/or etching with respect to the semiconductor wafer, before the single-crystal silicon integrated circuit is cut out from the semiconductor wafer, and the polishing may be MRF (Magnetorheological Finishing) or the like.

Further, after the single crystal silicon integrated circuits are formed on the insulating substrate, a non-single-crystal silicon transistor may be formed on a side of the surface, with which the single-crystal silicon integrated circuits are bonded, of the insulating substrate. This allows obtaining of a semiconductor device in which the single-crystal silicon integrated circuit and the non-single-crystal silicon integrated circuit coexist.

Further, the single-crystal silicon integrated circuit may be formed on the insulating substrate after the non-single-crystal silicon integrated circuit is formed on the insulating substrate. This allows obtaining of a semiconductor device in which (i) each of the single-crystal silicon integrated circuits is surrounded by the oxide, and (ii) the single-crystal silicon integrated circuit and the non-single-crystal silicon integrated circuit coexist.

It is possible to adapt the present invention to a sheet computer, or a high performance integrated circuit on a low-cost general-use insulating substrate such as a glass substrate.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A semiconductor wafer, comprising:
    a buried oxide layer formed on a silicon substrate;
    a desired number of single-crystal silicon integrated circuits formed in an active layer on the buried oxide layer each single-crystal silicon integrated circuit comprising a plurality of single-crystal silicon devices; and
    an oxide for covering the single-crystal silicon integrated circuits,
    the oxide being filled in (i) a region between adjacent single-crystal silicon integrated circuits, and (ii) a region between adjacent devices in each of the single-crystal silicon integrated circuits, the oxide having such a depth that reaches the buried oxide layer, wherein each single-crystal silicon integrated circuit is surrounded by an oxide.

2. The semiconductor wafer as set forth in claim 1, wherein the oxide is made of a same material as the buried oxide layer.

3. A method for fabricating a semiconductor wafer, comprising the steps of:
    (A) forming an buried oxide layer on a silicon substrate;
    (B) forming a desired number of single-crystal silicon integrated circuits in an active layer on the buried oxide layer, each single-crystal silicon integrated circuit comprising a plurality of single-crystal silicon devices;
    (C) causing (i) a separation of the single-crystal silicon integrated circuits, and (ii) a separation of devices in each of the single-crystal silicon integrated circuits to be simultaneously carried out by using an oxide; and
    (D) causing the single crystal silicon integrated circuits to be surrounded by the oxide.

4. The method as set forth in claim 3, wherein:
    the step (C) is carried out by (i) forming a first groove in a region where adjacent single-crystal silicon integrated circuits are separated from one another, and a second groove in a region where devices in each of the single-crystal silicon integrated circuits are separated from one another, each of the first and second grooves having such a depth that reaches the buried oxide layer, and (ii) filling an oxide simultaneously in the first and second grooves.

* * * * *